United States Patent
Chen et al.

(10) Patent No.: US 6,609,926 B1
(45) Date of Patent: Aug. 26, 2003

(54) ELECTRICAL CONNECTOR WITH ANTI-ROTATION MECHANISM

(75) Inventors: Xinhua Chen, Kunsan (CN); Xiaoping Shao, Kunsan (CN); Ren-Chih Li, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/198,414

(22) Filed: Jul. 17, 2002

(30) Foreign Application Priority Data

Apr. 30, 2002 (TW) ...................... 91205997 U

(51) Int. Cl.[7] .......................................... H01R 13/625
(52) U.S. Cl. ...................................... 439/342; 439/259
(58) Field of Search ................... 439/342, 259, 439/265, 266, 268, 263

(56) References Cited

U.S. PATENT DOCUMENTS

| | | | | |
|---|---|---|---|---|
| 6,071,140 A | * | 6/2000 | McHugh et al. | ............ 439/342 |
| 6,086,402 A | * | 7/2000 | Huang | ........................ 439/342 |
| 6,254,415 B1 | * | 7/2001 | Mizumura et al. | .......... 439/342 |
| 6,280,224 B1 | * | 8/2001 | Huang | ........................ 439/342 |
| 6,296,507 B1 | * | 10/2001 | Huang | ........................ 439/342 |
| 6,338,640 B1 | * | 1/2002 | Lin | ............................. 439/342 |

* cited by examiner

Primary Examiner—Hien Vu
(74) Attorney, Agent, or Firm—Wei Te Chung

(57) ABSTRACT

An electrical connector (1) with anti-rotation mechanism includes an insulative base (10), a cover (12) slidably mounted on the base, a plurality of conductive terminals (19) received in passageways (101) defined in the base, an actuator (16) received in the base and the cover, and an anti-rotation mechanism (14). The actuator can actuate the cover to slide along the base. The anti-rotation mechanism includes a cover plate (141) retained in the cover, and a base plate (142) received in the base. The cover plate and the base plate respectively include a pair of guiding blocks (1413), and a pair of guiding slots (1422) movably receiving the guiding blocks. When the actuator actuates the cover to slide along the base, the anti-rotation mechanism prevents or minimizes rotation between the cover plate and the base plate.

4 Claims, 4 Drawing Sheets

ELECTRICAL CONNECTOR WITH ANTI-ROTATION MECHANISM

BACKGROUND OF THE INVENTION

1. Field of the Invention

The present invention relates to an electrical connector for electrically connecting a central processing unit (CPU) with a printed circuit board (PCB), and particularly to an electrical connector with a cover and an anti-rotation mechanism.

2. Description of Prior Art

CPU sockets are widely used in personal computer (PC) systems to electrically connect CPUs with PCBs. A CPU socket usually comprises a base, and a cover slidably engaged on the base. A cam actuator actuates the cover to slide along the base, such that contact pins of the CPU are pushed to electrically mate with a multiplicity of contacts secured in the base.

A conventional cam actuator is disclosed in "BGA Socket: a dendritic solution" (P460-P466,1996 IEEE 46$^{th}$ Electronic Components & Technology Conference). When a CPU socket is manufactured to have a cam actuator, the CPU socket can have a low profile. U.S. Pat. Nos. 6,250,941, 6,254,415, 6,280,224, 6,296,507 and 6,338,640 all disclose conventional cam actuators used in CPU sockets. Referring to FIG. 5, U.S. Pat. No. 6,338,640 discloses a cam actuator 26 of a CPU socket 2. The actuator 26 comprises a plurality of cylindrical portions. The cylindrical portions progressively decrease in diameter from top to bottom. Central axes of the cylindrical portions are offset from each other. A protecting mechanism 24 comprises a cover plate 241 that is insert-molded in the cover 22, and a base plate 242 that is received in a recess 201 of the base 20.

When the CPU socket 2 is assembled, the actuator 26 is positioned in the cover plate 241 and the base plate 242. In operation, the actuator 26 is rotated to push the cover plate 241 to slide along the base plate 242. This actuates the cover 22 to slide along the base 20.

Conventionally, when the cover 22 slides along the base 20, the cover plate 241 of the protecting mechanism 24 slides along and directly rubs a top surface of the base plate 242. This can result in rotation of the cover plate 241 relative to the base plate 242. When this happens, the cover 22 may not slide properly or may fail to slide altogether. Furthermore, damage to the whole CPU socket 2 may result.

A new CPU socket that overcomes the above-mentioned problems is desired.

SUMMARY OF THE INVENTION

An object of the present invention is to provide an electrical connector which prevents or minimizes rotation of a cover thereof relative to a base thereof.

In order to achieve the above object, an electrical connector with anti-rotation mechanism in accordance with a preferred embodiment of the present invention comprises an insulative base, a cover, a plurality of conductive terminals, an actuator, an anti-rotation mechanism and a washer. The cover is slidably mounted on the base. The conductive terminals are received in passageways defined in the base. The actuator can actuate the cover to slide along the base. The anti-rotation mechanism comprises a cover plate retained in the cover, and a base plate received in the base. The cover plate and the base plate respectively comprise a pair of guiding blocks, and a pair of guiding slots movably receiving the guiding blocks. When the actuator actuates the cover to slide along the base, the anti-rotation mechanism prevents or minimizes rotation between the cover plate and the base plate.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
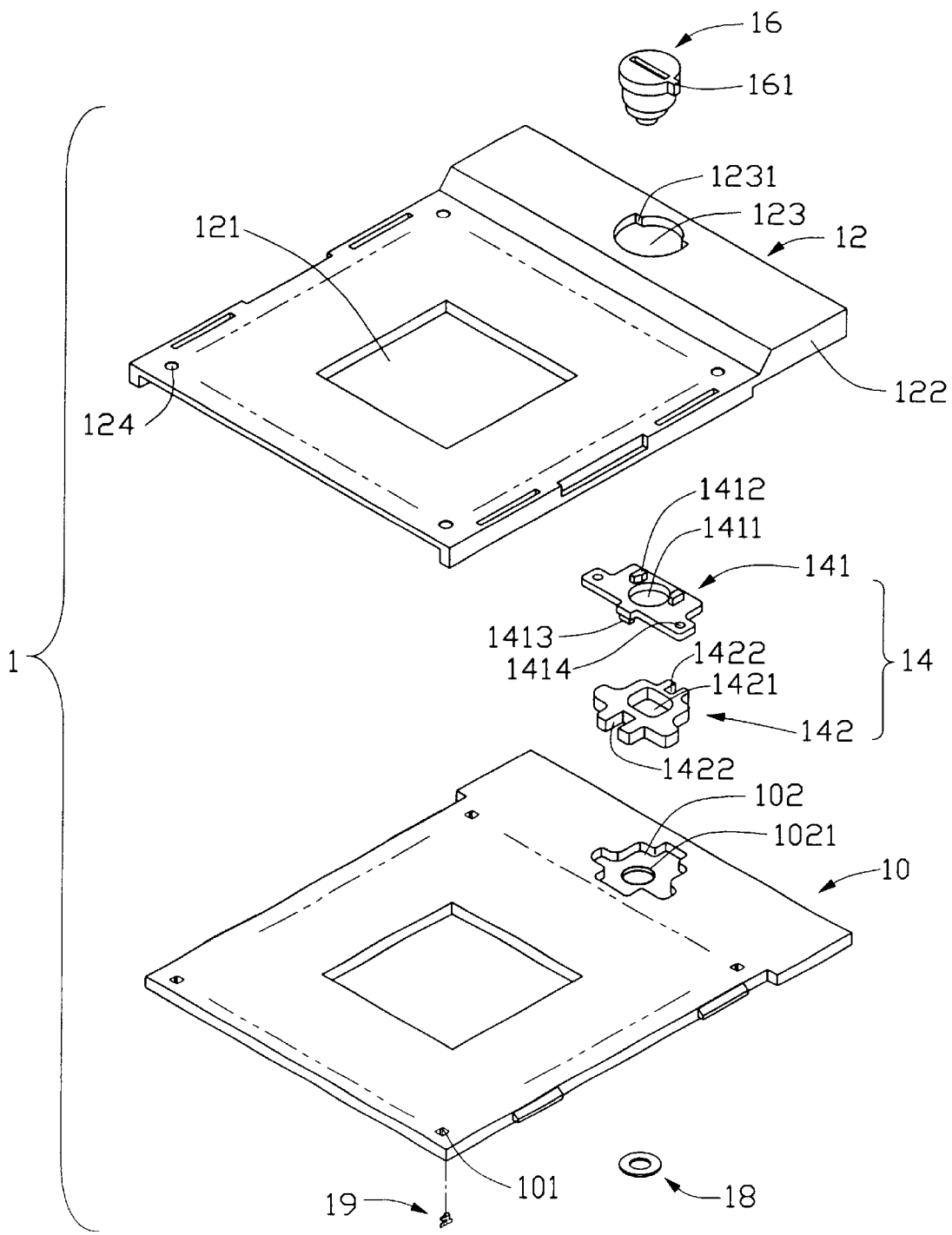
FIG. 1 is a simplified exploded, isometric view of a CPU socket in accordance with a preferred embodiment of the present invention, the CPU socket comprising an anti-rotation mechanism and an actuator.
Figure 2:
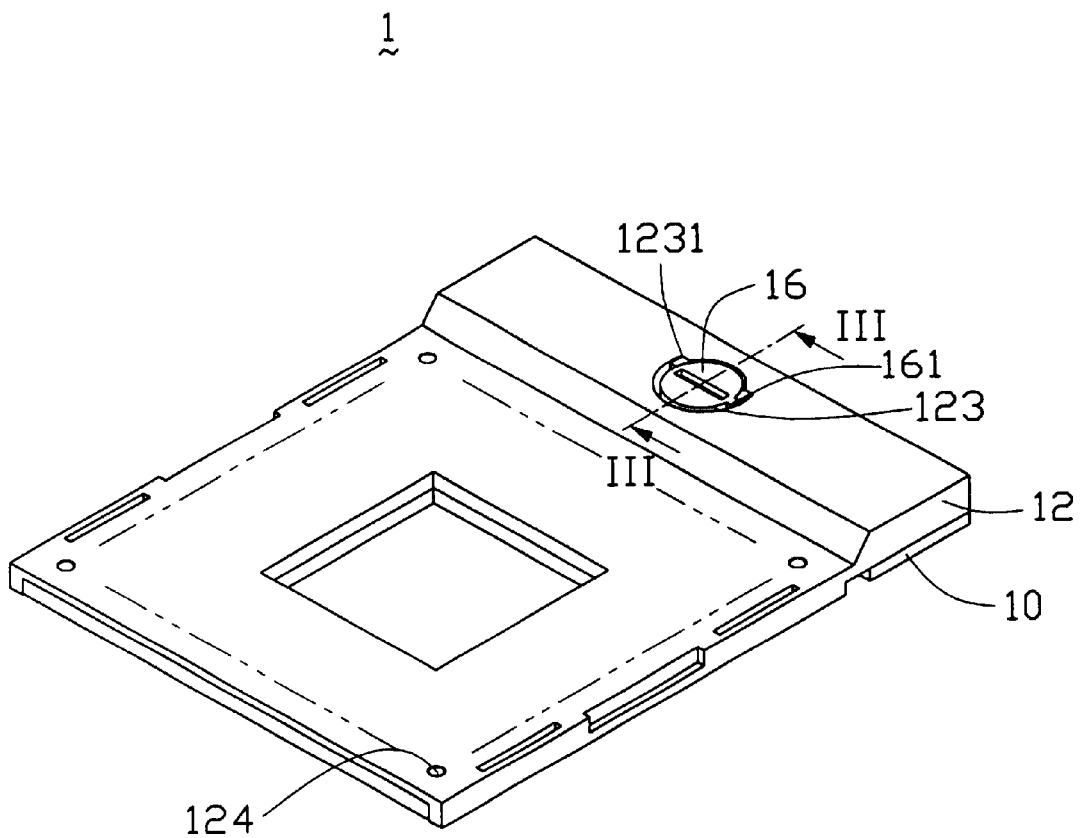
FIG. 2 is an assembled view of FIG. 1.

Referring to FIGS. 1 and 2, an electrical connector 1 with anti-rotation mechanism in accordance with a preferred embodiment of the present invention comprises an insulative base 10, and a cover 12 slidably engaged on the base 10.

The base 10 is generally rectangular. A multiplicity of passageways 101 is defined in the base 10. The passageways 101 form a rectangular array, and a multiplicity of conductive terminals 19 is respectively received in the passageways 101. A first recess 102 is defined in a middle of one end of the base 10. A circular through hole 1021 is defined in the base 10 at a middle of and in communication with the first recess 102, for receiving an actuator 16.

The cover 12 comprises a square opening 121 defined in a middle thereof, and a raised ledge 122 formed at one end thereof. A top hole 123 is defined in a middle of the ledge 122, corresponding to the circular through hole 1021 of the base 10. The top hole 123 comprises a semicircular portion, and a contiguous segment-shaped portion. A radius of the semicircular portion is greater than a radius of the segment-shaped portion. Accordingly, a pair of spaced stop walls 1231 is formed in the ledge 122 at the junction of the semicircular portion and the segment-shaped portion. A multiplicity of passages 124 is defined in the cover 12, corresponding to the passageways 101 of the base 10. A second recess (not shown) is defined in an underside of the cover 12, corresponding to the first recess 102 of the base 10.

Figure 3:
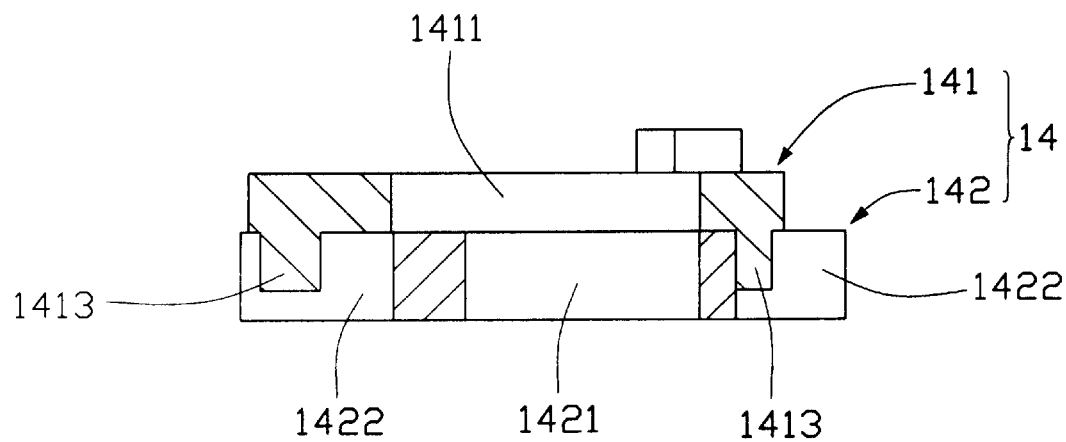
FIG. 3 is a cross-sectional view of the anti-rotation mechanism only of the CPU socket, taken along line III—III of FIG. 2 and showing the anti-rotation mechanism in a locked position.

The anti-rotation mechanism 14 comprises a generally T-shaped metal cover plate 141, and a metal base plate 142. The cover plate 141 is insert-molded in the second recess (not shown) of the cover 12. The base plate 142 is received in the first recess 102 of the base 10. The cover plate 141 comprises a circular through hole 1411 defined in a middle thereof. A pair of stops 1412 extends upwardly from the cover plate 141 adjacent the through hole 1411. The stops 1412 are chambered to correspond to a proximate curvature of the through hole 1411. The cover plate 141 further comprises a pair of small fixing holes 1414 defined in opposite ends thereof respectively, for facilitating insert-molding of the cover plate 141 in the second recess (not shown) of the cover 12. Referring also to FIG. 3, a pair of guiding blocks 1413 depends from opposite long sides of the cover plate 141 respectively. The base plate 142 defines a square through hole 1421 in a middle thereof. A pair of guiding slots 1422 is defined in opposite sides of the base plate 142 respectively, corresponding to the guiding blocks 1413 of the cover plate 141.

The actuator 16 comprises a plurality of cylindrical portions formed one on the other. The cylindrical portions progressively decrease in diameter from top to bottom. Central axes of the cylindrical portions are offset from each other. A lateral protrusion 161 protrudes from a circumferential periphery of a topmost cylindrical portion. A washer 18 is used to secure the actuator 16 in the electrical connector 1.

In assembly, the base plate 142 is received in the recess 102 of the base 10. The cover 12 together with the insert-molded cover plate 141 is attached on the base 10. The actuator 16 is sequentially extended through the top hole 123 and the through holes 1411, 1421 and 1021. One column of the actuator 16 protrudes beyond the through hole 1021, and is riveted with the washer 18 to secure the actuator 16 in the electrical connector 1. Thus the base 10, the cover 12, the actuator 16 and the anti-rotation mechanism 14 are assembled together. Contact pins of a CPU (not shown) can be inserted through the passages 124 of the cover 12 to engage with the terminals 19 in the passageways 101 of the base 10. The stops 1412 of the cover plate 141 abut against the stop walls 1231 of the cover 12. Rotation of the protrusion 161 of the actuator 16 is restricted between a position where the actuator 16 abuts against one of the stops 1412 of the cover plate 141, and a position where the protrusion 161 abuts against the other stop 1412 of the cover plate 141. Thus a distance that the cover 12 can slide is limited.

Figure 4:
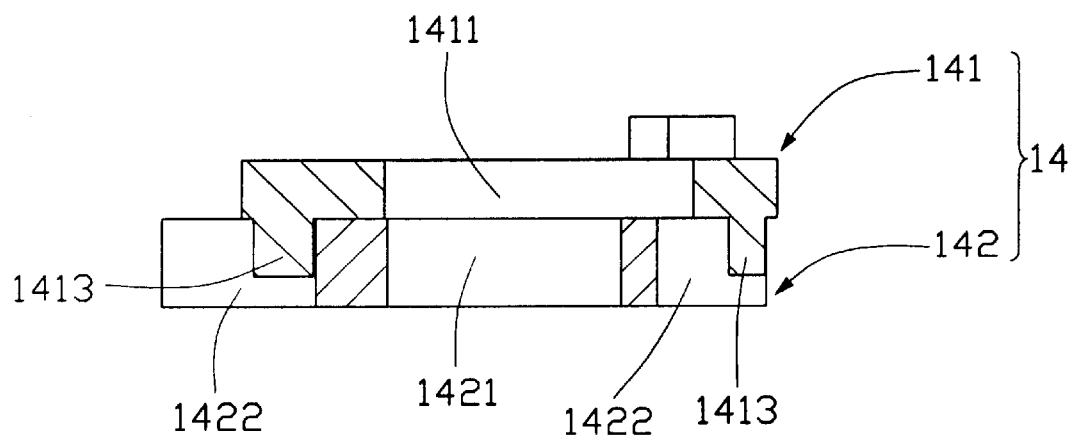
FIG. 4 is similar to FIG. 3, but showing the anti-rotation mechanism in an open position.
Figure 5:
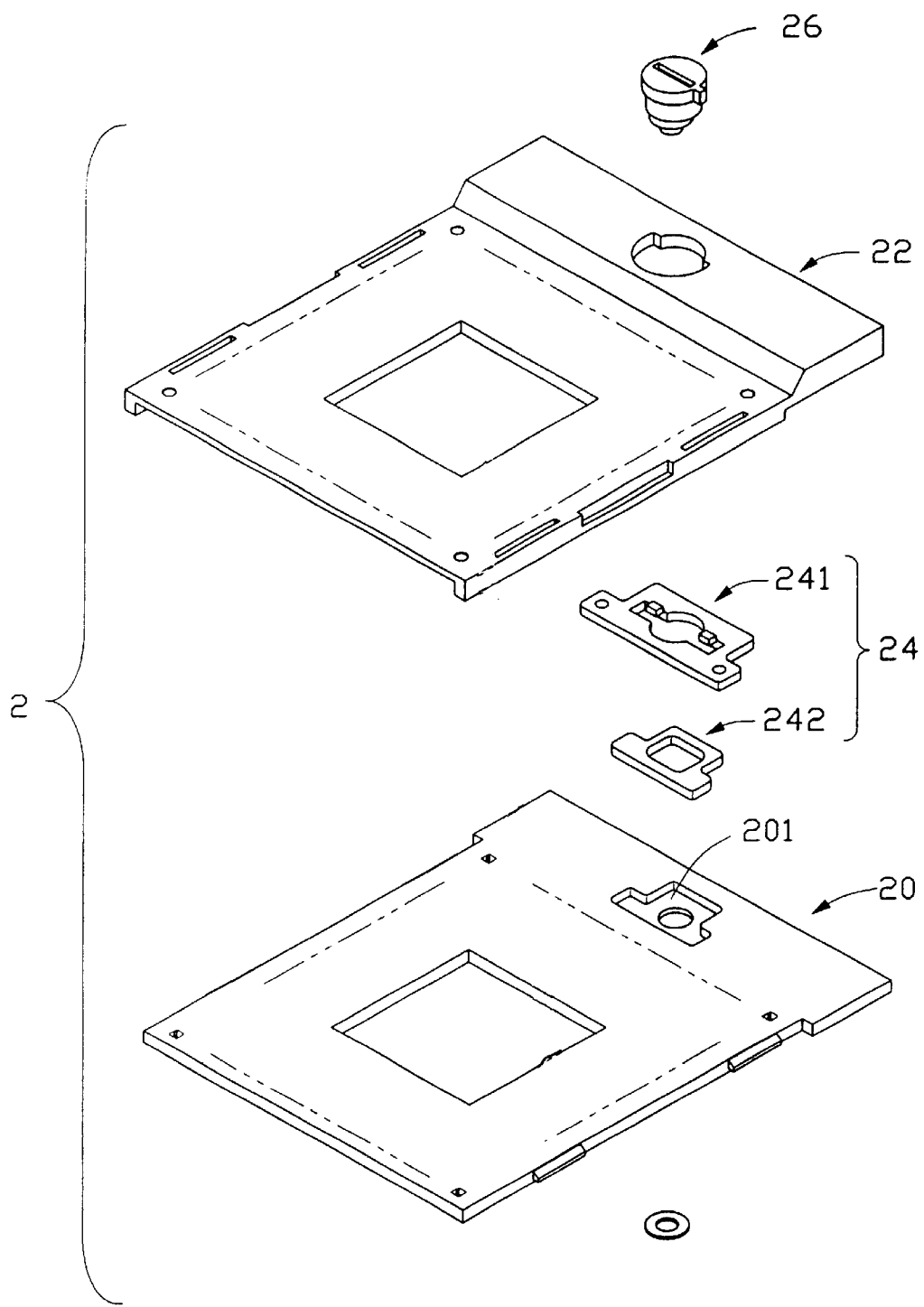
FIG. 5 is a simplified exploded, isometric view of a conventional CPU socket.

Referring particularly to FIGS. 3 and 4, when the cover 12 slides along the base 10, the guiding blocks 1413 of the cover plate 141 slide along the guiding slots 1422 of the base plate 142. Accordingly, rotation as between the base plate 142 and the cover plate 141 is prevented or at least minimized. This ensures that the cover 12 slides along the base 10 accurately and safely.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector comprising:
   an insulative base defining a plurality of passageways;
   a plurality of conductive terminals disposed in the corresponding passageways, respectively;
   a cover slidably mounted on the base and defining a plurality of through holes in alignment with the corresponding passageways, respectively;
   a cover plate secured to an undersurface of the cover;
   a base plate secured to an upper face of the base generally vertically aligned with said cover plate; and
   an actuator extending through said cover, the cover plate, the base plate and the base and actuating the cover to move relative to the base in a front-to-back direction; wherein
      at least one of said cover plate and said base plate includes guiding blocks on opposing sides thereon and extending in a vertical direction toward the other of the cover plate or the base plate which has guiding slots for guidably engaging with the guiding blocks so as to assure said cover plate to move relative to the base plate along said front-to-back direction without titling; wherein
         a first recess is defined in the base, the first recess receives the base plate, and a through hole is defined in the base plate; wherein
            a pair of fixing holes is defined in opposite ends of the cover plate, and
            a through hole is defined in the cover plate; wherein
               a pair of stops is arranged on the cover plate, and the stops are chamfered to correspond to the through hole of the cover plate.

2. The electrical connector as described in claim 1, wherein the guiding blocks are arranged at an underside of the cover plate, and the guiding slots are defined in the base plate.

3. The electrical connector as described in claim 1, wherein the guiding blocks are arranged on the base plate, and the guiding slots are defined in the cover plate.

4. The electrical connector as described in claim 1, wherein a hole is defined in the cover, the hole receives the actuator, and the hole is configured such that a pair of stop walls is formed in the cover at the hole.

* * * * *